United States Patent
Hyodo et al.

(10) Patent No.: US 7,655,577 B2
(45) Date of Patent: Feb. 2, 2010

(54) METHOD OF FORMING SILICON-CONTAINING INSULATION FILM HAVING LOW DIELECTRIC CONSTANT AND LOW FILM STRESS

(75) Inventors: Yasuyoshi Hyodo, Tokyo (JP); Nobuo Matsuki, Tokyo (JP); Masashi Yamaguchi, Tokyo (JP); Atsuki Fukazawa, Tokyo (JP); Naoki Ohara, Tokyo (JP); Yijun Liu, Phoenix, AZ (US)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 11/550,930

(22) Filed: Oct. 19, 2006

(65) Prior Publication Data
US 2007/0111540 A1 May 17, 2007

Related U.S. Application Data

(62) Division of application No. 10/644,195, filed on Aug. 20, 2003, now Pat. No. 7,148,154.

(51) Int. Cl.
*H01L 21/00* (2006.01)
(52) U.S. Cl. .......... 438/795; 438/99; 438/308; 438/378; 438/778; 438/780; 257/40; 257/642; 257/E51.007; 257/E51.046; 257/E27.117
(58) Field of Classification Search .......... 438/778, 438/780, 99, 308, 378, 795; 257/40, 642, 257/E39.007, E51.007, E51.046, E27.117
See application file for complete search history.

(56) References Cited

U.S. PATENT DOCUMENTS

| | | | |
|---|---|---|---|
| 3,822,928 A | 7/1974 | Smolinsky et al. | |
| 6,455,445 B2 | 9/2002 | Matsuki | |
| 6,596,627 B2 | 7/2003 | Mandal | |
| 6,649,540 B2 * | 11/2003 | Wang et al. | 438/789 |
| 6,784,123 B2 | 8/2004 | Matsuki | |
| 6,818,570 B2 | 11/2004 | Tsuji et al. | |
| 6,855,645 B2 | 2/2005 | Tang et al. | |
| 6,897,163 B2 * | 5/2005 | Gaillard et al. | 438/778 |
| 7,064,088 B2 | 6/2006 | Hyodo et al. | |
| 2003/0100175 A1 | 5/2003 | Nobutoki et al. | |
| 2004/0137757 A1 | 7/2004 | Li et al. | |
| 2004/0152338 A1 | 8/2004 | Gaillard et al. | |

FOREIGN PATENT DOCUMENTS

JP   2001-274153 A   10/2001

OTHER PUBLICATIONS

Office Action dated Jul. 16, 2008, U.S. Appl. No. 11/550,917, filed Oct. 19, 2006 to Hyodo et al., 14 pages.

* cited by examiner

*Primary Examiner*—Laura M Menz
*Assistant Examiner*—Colleen E Snow
(74) *Attorney, Agent, or Firm*—Knobbe, Martens, Olson & Bear LLP

(57) ABSTRACT

A method for forming a silicon-containing insulation film on a substrate by plasma polymerization includes: introducing a reaction gas comprising (i) a source gas comprising a silicon-containing hydrocarbon cyclic compound containing at least one vinyl group (Si-vinyl compound), and (ii) an additive gas, into a reaction chamber where a substrate is placed; and applying radio-frequency power to the gas to cause plasma polymerization, thereby depositing an insulation film on the substrate.

11 Claims, 1 Drawing Sheet

METHOD OF FORMING SILICON-CONTAINING INSULATION FILM HAVING LOW DIELECTRIC CONSTANT AND LOW FILM STRESS

CROSS-REFERENCE TO RELATED APPLICATIONS

This is a divisional application of U.S. patent application Ser. No. 10/644,195, filed Aug. 20, 2003, the disclosure of which is herein incorporated by reference in its entirety.

BACKGROUND OF THE INVENTION

1. Field of the Invention

This invention relates generally to a semiconductor technique and more particularly to a method for forming on a semiconductor substrate a silicon-containing insulation film having low film stress by using a plasma CVD (chemical vapor deposition) apparatus.

2. Description of the Related Art

As semiconductors have progressed to accommodate a demand for high speed and high density in recent years, a reduction of capacitance between lines is required to avoid signal delays in the multi-layer wiring technology field. Because a reduction in the dielectric constant of a multi-layer wiring insulation film is required in order to reduce the capacitance between lines, insulation films having low dielectric constants have been developed.

Conventionally, a silicon oxide ($SiO_x$) film is formed by adding oxygen ($O_2$), nitric oxide (NO) or nitrous oxide ($N_2O$) as an oxidizing agent to a silicon source gas such as $SiH_4$ and $Si(OC_2H_5)_4$ and applying heat or plasma energy to the source gas. A dielectric constant ($\epsilon$) of this film was approximately 4.0.

If a source gas having two alkoxy groups is used, the dielectric constant of a resulting film can be lowered. For example, by using $(CH_3)_2Si(OCH_3)_2$ as a source gas, a siloxan polymer film having a dielectric constant of 3.0 or lower can be formed by plasma polymerization.

However, films having a dielectric constant of 3.0 or lower have high film stress such as 70 MPa. Because a semiconductor device has multiple layers, if insulation films have high film stress, the adverse effect becomes significant. As a result, such a semiconductor device may not function as is designed. Thus, a reduction of film stress is required.

SUMMARY OF THE INVENTION

Conventionally, for plasma polymerization, high-frequency power (e.g., 13.56 MHz) is applied to generate a plasma. By overlaying low-frequency power (e.g., 400 kHz) and high-frequency power, it is possible to lower film stress. However, when a ratio of low-frequency power to high-frequency power is increased, the dielectric constant of the film increases. Thus, it is difficult to form a film having a low dielectric constant and low film stress.

One aspect of the present invention is characterizable in that a silicon-containing hydrocarbon compound having at least one vinyl group is used as a source gas for plasma polymerization, thereby forming a film having low film stress without increasing a dielectric constant.

In an embodiment, the present invention provides a method for forming a silicon-containing insulation film on a substrate by plasma polymerization, comprising the steps of: (a) introducing a reaction gas comprising (i) a source gas comprising a silicon-containing hydrocarbon compound containing at least one vinyl group (Si-vinyl compound), and (ii) an additive gas, into a reaction chamber where a substrate is placed; and (b) applying radio-frequency power to the gas to cause plasma polymerization, thereby depositing an insulation film on the substrate.

In the above, in an embodiment, the Si-vinyl compound includes, but is not limited to, a compound or compounds selected from the group consisting of linear silicon-containing hydrocarbon compounds having the formula $Si_\alpha O_{60-1} R_{2\alpha-\beta+2}(OR)_\beta$ wherein $\alpha$ is an integer of 1-3, $\beta$ is 0, 1, or 2, R is $C_{1-6}$ saturated or unsaturated hydrocarbon, and at least one R attached to Si contains a vinyl group; cyclic compounds having the formula $Si_n O_n R_{2n}$, wherein n is an integer of 3-6, R is $C_{1-6}$ saturated or unsaturated hydrocarbon, and at least one R attached to Si contains a vinyl group; and cyclic compounds having the formula $Si_p(C_2H_2)_p R_{2p}$ wherein p is an integer of 3-6, and R is $C_{1-6}$ saturated or unsaturated hydrocarbon. For example, R may be $-C_z H_{2(z-w)+1}$ wherein z is an integer of 2-4, and w represents the number of unsaturated carbon bonds and is an integer of 1-3. Further, the Si-vinyl compound may be a liner compound wherein $\alpha$ is 1 and $\beta$ is 0. For example, the compound is $(CH_3)_2Si(C_2H_3)_2$. In another embodiment, the Si-vinyl compound is a cyclic compound wherein n is 3. The compounds described above can be used singly or in any combination of two or more compounds.

In an embodiment, radio-frequency (RF) power is high-frequency power without low-frequency power. In the embodiment, the use of the Si-vinyl compound effectively reduce film stress, and thus, there is no need to overlay high-frequency RF power and low-frequency RF power. For example, high-frequency power has 2 MHz or higher frequencies (including (including 5, 10, 15, 20, 25, 30, 40, 50, 60, 70 MHz, and ranges including any of the forgoing). However, in an embodiment, a combination of high-frequency RF power having 2 MHz or higher frequencies and low-frequency RF power having less than 2 MHz frequencies can be used (the ratio of low-frequency power to high-frequency power may be less than 50% including 40%, 30%, 20%, 10%, 5%, and ranges including any of the forgoing (preferably, 3%-30%). High-frequency RF power may be applied at a high power level such as 1.5 W/cm² or higher (including 2.0, 2.25, 2.5, 2.75, 3.0, 3.25, 3.5 W/cm², and ranges including any of the foregoing). Such a high power level can increase the mechanical strength and deposition rate of a resultant insulation film.

According to the above embodiments, the film having low stress can be formed without sacrificing dielectric property. In an embodiment, the dielectric constant can further be reduced. However, in some cases, when using solely the Si-vinyl compound, the mechanical strength of the film may decrease. In order to compensate for a reduction of mechanical strength, the addition of a silicon-containing hydrocarbon compound (Si compound) having no vinyl group to the source gas may be effective.

In the above, in an embodiment, the Si compound includes, but is not limited to, a compound or compounds selected from the group consisting of linear compounds having the formula $Si_\alpha O_{\alpha-1} R_{2\alpha-\beta+2}(OR)_\beta$ wherein $\alpha$ is an integer of 1-3, $\beta$ is 0, 1, or 2, R is $C_{1-6}$ saturated hydrocarbon; and cyclic compounds having the formula $Si_n O_n R_{2n}$, wherein n is an integer of 3-6, R is $C_{1-6}$ saturated hydrocarbon. In an embodiment, the flow ratio of the Si-vinyl compound to the Si compound may be in the range of 1% to 100% (including 5%, 10%, 20%, 30%, 40%, 50%, 60%, 70%, 80%, 90%, and ranges including any of the forgoing).

Further, the additive gas may be selected from the group consisting of a carrier gas, an oxidizing gas, and a plasma stabilizing gas. In an embodiment, the plasma stabilizing gas includes, but is not limited to, a gas selected from the group consisting of $H_2$, $CnH_{2n+2}$, $C_nH_{2n}$, and $CnH_{2n+1}OH$ wherein n is an integer of 1-5. In an embodiment, the oxidizing gas includes, but is not limited to, a gas selected from the group consisting of $O_2$, $CO_2$, $H_2O$, $O_3$, and $NO_2$. In an embodiment, the carrier gas includes, but is not limited to, an inert gas selected from the group consisting of He, Ar, and $N_2$.

In an embodiment, the ratio of the Si-vinyl compound to the Si compound may be controlled to obtain a siloxan polymer having a film stress of 60 MPa or lower (including 50 MPa, 40 MPa, 30 MPa, 20 MPa, 10 MPa, and ranges including any of the forgoing) and a dielectric constant of 3.0 or lower (including 2.9, 2.8, 2.7, 2.6, 2.5, 2.4, 2.3, and ranges including any of the forgoing). If the Si-vinyl compound and the Si compound do not contain Si—O bonds and additional oxygen is not supplied, a hard film composed of a silicon carbide material can be formed which may have a dielectric constant of 4.5 or lower (including 4.0, 3.5, 3.0, and ranges including any of the forgoing).

In another aspect, the present invention provides a method for forming a silicon-containing insulation film on a substrate by plasma polymerization, comprising the steps of: (a) introducing a reaction gas comprising (i) a source gas comprising a silicon-containing hydrocarbon compound containing at least one vinyl group (Si-vinyl compound); (ii) a silicon-containing hydrocarbon compound (Si compound) having no vinyl group; and (iii) an additive gas, into a reaction chamber where a substrate is placed; (b) controlling the ratio of the Si-vinyl compound to the Si compound in the range of 10% to 100%; and (c) applying radio-frequency power to the gas to cause plasma polymerization, thereby depositing an insulation film on the substrate. The compounds described above can be used in this embodiment. Further, the conditions described above can also be applied in this embodiment.

Additionally, after forming an insulation film on a substrate, the substrate can be subjected to any suitable curing treatment such as electron beam irradiation treatment, plasma treatment (e.g., hydrogen plasma treatment), and other annealing processes in order to reinforce mechanical strength of the resulting film.

In the present invention, an "insulation film" includes any dielectric film regardless of its intended use such as cap layers, hard films, laminated insulation layers, etc.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

DETAILED DESCRIPTION OF THE PREFERRED EMBODIMENT

Figure 1:
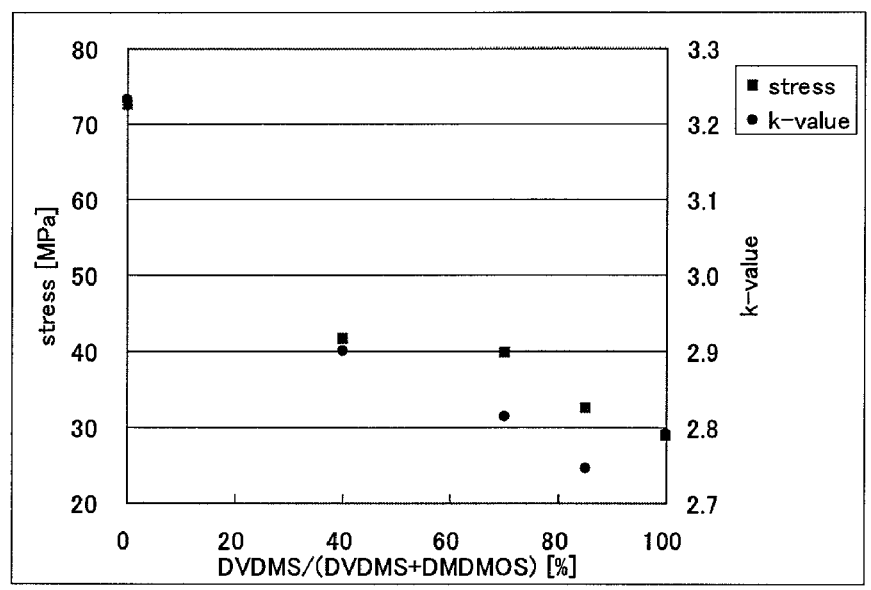
FIG. 1 is a graph illustrating the relationship between the ratio of divinyldimethylsilan (DVDMS)/(divinyldimethylsilan (DVDMS)+dimethyldimethoxysilane (DMDMOS)) and film stress and dielectric constant.

The present invention will be described in detail below with reference to preferred embodiments. However, the present invention simply includes these embodiments and should not be limited thereto.

In an embodiment of the present invention, a reaction gas comprising (i) a source gas comprising a silicon-containing hydrocarbon compound containing at least one vinyl group (Si-vinyl compound), and (ii) an additive gas. Any suitable Si-vinyl compounds can be used. For example, a usable compound or compounds may be selected from the group consisting of linear silicon-containing hydrocarbon compounds having the formula $Si_\alpha O_{\alpha-1} R_{2\alpha-\beta+2}(OR)_\beta$ wherein α is an integer of 1-3, β is 0, 1, or 2, R is $C_{1-6}$ saturated or unsaturated hydrocarbon, and at least one R attached to Si contains a vinyl group; cyclic compounds having the formula $Si_n O_n R_{2n}$, wherein n is an integer of 3-6, R is $C_{1-6}$ saturated or unsaturated hydrocarbon, and at least one R attached to Si contains a vinyl group; and cyclic compounds having the formula $Si_p(C_2H_2)_p R_{2p}$ wherein p is an integer of 3-6, and R is $C_{1-6}$ saturated or unsaturated hydrocarbon. R may be —$C_z H_{2(z-w)+1}$ wherein z is an integer of 2-4, and w represents the number of unsaturated carbon bonds and is an integer of 1-3. The above compounds can be used singly or in any combination of two or more compounds.

The linear Si-vinyl compounds include, but are not limited to, the following compounds:

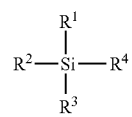

wherein R1, R2, R3, and R4 are each independently $C_{1-6}$ saturated or unsaturated hydrocarbon such as $CH_3$, $C_2H_3$, $C_2H_5$, $C_3H_7$, $C_6H_5$, $C_2H_3$, $C_3H_5$, $C_4H_7$, and $C_4H_5$, and at least one of R1, R2, R3, and R4 contains a vinyl group. An oxidizing gas may be added to supply oxygen to form a siloxan polymer. When using the Si-vinyl compound of the above formula without supplying additional oxygen, a silicon carbide film can be formed. As this type of compound, $(CH_3)_3Si(C_2H_3)$, $(CH_3)_2Si(C_2H_3)_2$, and $(C_6H_5)Si(C_2H_3)_3$ can be used, for example.

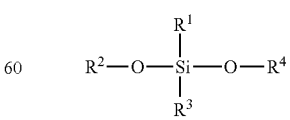

wherein R1, R2, R3, and R4 are each independently $C_{1-6}$ saturated or unsaturated hydrocarbon such as $CH_3$, $C_2H_3$, $C_2H_5$, $C_3H_7$, $C_6H_5$, $C_2H_3$, $C_3H_5$, $C_4H_7$, and $C_4H_5$, and at least one of R1 and R3 contains a vinyl group.

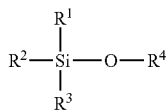

wherein R1, R2, R3, and R4 are each independently C$_{1-6}$ saturated or unsaturated hydrocarbon such as CH$_3$, C$_2$H$_3$, C$_2$H$_5$, C$_3$H$_7$, C$_6$H$_5$, C$_2$H$_3$, C$_3$H$_5$, C$_4$H$_7$, and C$_4$H$_5$, and at least one of R1, R2, and R3 contains a vinyl group. An oxidizing gas may be added to supply oxygen to form a siloxan polymer.

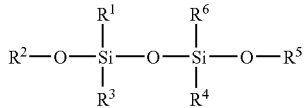

wherein R1, R2, R3, R4, R5, and R6 are each independently C$_{1-6}$ saturated or unsaturated hydrocarbon such as CH$_3$, C$_2$H$_3$, C$_2$H$_5$, C$_3$H$_7$, C$_6$H$_5$, C$_2$H$_3$, C$_3$H$_5$, C$_4$H$_7$, and C$_4$H$_5$, and at least one of R1, R3, R4, and R6 contains a vinyl group.

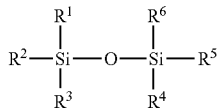

wherein R1, R2, R3, R4, R5, and R6 are each independently C$_{1-6}$ saturated or unsaturated hydrocarbon such as CH$_3$, C$_2$H$_3$, C$_2$H$_5$, C$_3$H$_7$, C$_6$H$_5$, C$_2$H$_3$, C$_3$H$_5$, C$_4$H$_7$, and C$_4$H$_5$, and at least one of R1, R3, R4, and R6 contains a vinyl group. An oxidizing gas may be added to supply oxygen to form a siloxan polymer. As this type of compound, 1,3-divinyl tetramethylsilane (DVTMS, [CH$_2$=CH$_2$Si(CH$_3$)$_2$]$_2$O) can be used, for example.

The cyclic Si-vinyl compounds include, but are not limited to, the following compounds:

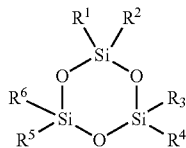

wherein R1, R2, R3, R4, R5, and R6 are each independently C$_{1-6}$ saturated or unsaturated hydrocarbon such as CH$_3$, C$_2$H$_3$, C$_2$H$_5$, C$_3$H$_7$, C$_6$H$_5$, C$_2$H$_3$, C$_3$H$_5$, C$_4$H$_7$, and C$_4$H$_5$, and at least one of R1, R2, R3, R4, R5, and R6 contains a vinyl group.

In an embodiment, the Si-vinyl compound may be a cyclic compound wherein n is 3. For example, the compounds include 1,3,5-trimethyl-1,3,5-trivinyilycyclotrisiloxane:

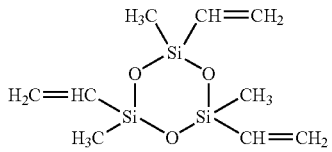

The cyclic Si-vinyl compounds having the formula Si$_p$(C$_2$H$_2$)$_p$R$_{2p}$, wherein p is an integer of 3-6, and R is C$_{1-6}$ saturated or unsaturated hydrocarbon, include, but are not limited to, the following compound:

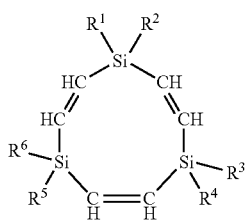

wherein R1, R2, R3, R4, R5, and R6, are each independently C$_{1-6}$ saturated or unsaturated hydrocarbon such as CH$_3$, C$_2$H$_3$, C$_2$H$_5$, C$_3$H$_7$, C$_6$H$_5$, C$_2$H$_3$, C$_3$H$_5$, C$_4$H$_7$, and C$_4$H$_5$. An oxidizing gas may be added to supply oxygen to form a siloxan polymer. When using the Si-vinyl compound of the above formula without supplying additional oxygen, a silicon carbide film can be formed.

In an embodiment, the source gas may further comprise a silicon-containing hydrocarbon compound (Si compound) having no vinyl group to improve mechanical strength. The Si compound may be a compound or compounds selected from the group consisting of linear compounds having the formula Si$_\alpha$O$_{\alpha-1}$R$_{2\alpha-\beta+2}$(OR)$_\beta$ wherein α is an integer of 1-3, β is 0, 1, or 2, R is C$_{1-6}$ saturated hydrocarbon; and cyclic compounds having the formula Si$_n$O$_n$R$_{2n}$, wherein n is an integer of 3-6, R is C$_{1-6}$ saturated hydrocarbon.

The flow ratio of the Si-vinyl compound to the Si compound may be in the range of 10% to 100% (including 20%, 30%, 40%, 50%, 60%, 70%, 80%, 90%, and ranges including any of the forgoing). The ratio may be controlled so as to obtain a film stress of 60 MPa or lower (including 50 MPa, 40 MPa, 30 MPa, 20 MPa, 10 MPa, and ranges including any of the forgoing) and a dielectric constant of 3.0 or lower (including 2.9, 2.8, 2.7, 2.6, 2.5, 2.4, 2.3, and ranges including any of the forgoing). Further, if the Si-vinyl compound and the Si compound do not contain Si—O bonds and additional oxygen is not supplied, a silicon carbide film can be formed which may have a dielectric constant of 4.5 or lower (including 4.0, 3.5, 3.0, and ranges including any of the forgoing).

Si compounds which can be mixed include a compound having at least one Si—O bond, two or less O—C$_n$H$_{2n+1}$ bonds and at least two hydrocarbon radicals bonded with silicon (Si). A preferable silicon-containing hydrocarbon compound has formula:

$$Si_\alpha O_{\alpha-1} R_{2\alpha-\beta+2}(OC_n H_{2n+1})_\beta$$

wherein α is an integer of 1-3, β is 0, 1, or 2, n is an integer of 1-3, and R is C$_{1-6}$ hydrocarbon attached to Si. In an embodiment, α is 1 or 2, and β is 2.

More specifically, the silicon-containing hydrocarbon compound includes at least one species of the compound expressed by the chemical formula:

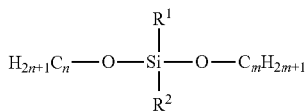

wherein R1 and R2 are each independently $C_{1-6}$ hydrocarbon such as $CH_3$, $C_2H_5$, $C_3H_7$, and $C_6H_5$, and m and n are any integer.

Except for the species indicated above, the silicon-containing hydrocarbon compound can include at least one species of the compound expressed by the chemical formula:

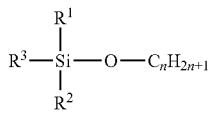

wherein R1, R2 and R3 are each independently $C_{1-6}$ hydrocarbon such as $CH_3$, $C_2H_5$, $C_3H_7$, and $C_6H_5$, and n is any integer.

Except for those species indicated above, the silicon-containing hydrocarbon compound can include at least one species of the compound expressed by the chemical formula:

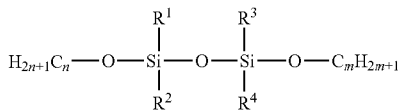

wherein R1, R2, R3 and R4 are each independently $C_{1-6}$ hydrocarbon such as $CH_3$, $C_2H_5$, $C_3H_7$, and $C_6H_5$, and m and n are any integer.

Further, except for those species indicated above, the silicon-containing hydrocarbon compound can include at least one species of the compound expressed by the chemical formula:

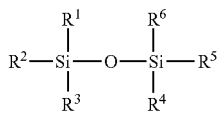

wherein R1, R2, R3, R4, R5 and R6 are each independently $C_{1-6}$ hydrocarbon such as $CH_3$, $C_2H_5$, $C_3H_7$, and $C_6H_5$, and the additive gases are argon (Ar), Helium (He) and either nitrogen oxide ($N_2O$) or oxygen ($O_2$).

Furthermore, except for those species indicated above, the silicon-containing hydrocarbon compound can include at least one species of the compound expressed by the chemical formula:

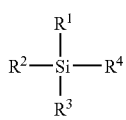

wherein R1, R2, R3 and R4 are each independently $C_{1-6}$ hydrocarbon such as $CH_3$, $C_2H_5$, $C_3H_7$, and $C_6H_5$, and the additive gases are argon (Ar), Helium (He) and either nitrogen oxide ($N_2O$) or oxygen ($O_2$).

These types of source gas is disclosed in U.S. Pat. No. 6,352,945, U.S. Pat. No. 6,383,955, and U.S. Pat. No. 6,432,846, all of which are incorporated herein by reference in their entirety. In embodiments, the source gas may be dimethyl-dimethoxysilane (DM-DMOS), 1,1,3,3-tetramethyldimethoxydisiloxane (TMDMOS), or phenylmethyl dimethoxysilane (PM-DMOS). Different source gases can be mixed or a single source gas can be used alone.

In an embodiment, the additive gas may be selected from the group consisting of a carrier gas, an oxidizing gas, and a plasma stabilizing gas.

The carrier gas can be any suitable inert gas including Ar, Ne, He, and $N_2$. The reaction gas may further comprise an oxygen-supplying gas (oxidizing gas). The inert gas may be supplied at a flow rate of 15-300% (50% or more in an embodiment) of that of the source gas. The oxygen-supplying gas can be any suitable gas which can supply oxygen and may include $O_2$, NO, $O_3$, $H_2O$, $CO_2$, and $N_2O$. In an embodiment, the oxygen-supplying gas may be supplied at a flow rate lower than that of the source gas (for the purpose of supplying oxygen, it can be used more). The addition of oxidizing gas is effective to activate a plasma. However, there may be cases where a plasma is overly activated. If an inert gas is added to stabilize a plasma, the dielectric constant tends to increase. Thus, in such cases, a plasma stabilizing gas can be used effectively. That is, in the above, in a case where even if film stress is appropriate, sufficient mechanical strength cannot be accomplished, by further introducing an additive gas selected from the group consisting of an oxidizing gas and a plasma stabilizing gas such as $C_xH_yO_z$ wherein x=0-5, y=2-12, and z=0-3 (such as $C_nH_{2n+2}$ (n=1-5), $C_nH_{2n}$ (n=1-5), $C_nH_{2n+1}OH$ (n=1-5)), into the reaction space when the source gas is introduced, hardness of the hard film can be improved while optimizing film stress of a film.

The flow rate of additive gas may be 0% to about 500% of the source gas flow (including 10%, 50%, 100%, 200%, 300%, 400%, and ranges including any of the foregoing). In an embodiment, the gas of $C_xH_yO_z$ may be selected from the group consisting of $H_2$, $C_nH_{2n+2}$ (n=1-5) (e.g., $CH_4$, $C_2H_6$, $C_3H_8$, $C_2H_4$, $C_3H_6$, $C_4H_8$), $C_{1-6}$ alkanol (e.g., $CH_3CH(OH)$ $CH_2OH$, $CH_3CH(OH)OCH_3$, $CH_3CH(OH)CH_2OCH_3$), and $C_{2-6}$ ether (e.g., $CH_3CH(OH)CH_3$). For example, preferably gases include reactive gases such as ethylene glycol, 1,2-propanediol, isopropyl alcohol (IPA), ethylene, or diethyl ether.

In an embodiment, the reaction gas is excited upstream of the reaction chamber. In this embodiment, the reaction gas can be excited in a remote plasma chamber installed upstream of a reactor, and the film is deposited on a substrate in the reactor. The source gas and the additive gas can be introduced into the remote plasma chamber. In this case, a reaction space is composed of the interior of the remote plasma chamber, the interior of the reactor, and the interior of the piping connecting the remote plasma chamber and the reactor. Because of using the interior of the remote plasma chamber, the interior of the reactor can be significantly reduced, and thus, the distance between the upper electrode and the lower electrode can be reduced. This leads to not only downsizing the reactor, but also uniformly controlling a plasma over the substrate surface. Any suitable remote plasma chamber and any suitable operation conditions can be used in the present invention. For example, usable are the apparatus and the conditions disclosed in U.S. patent applications Ser. No. 09/511,934 filed Feb. 24, 2000 and Ser. No. 09/764,523 filed Jan. 18, 2001, U.S. Pat. No. 5,788,778, and U.S. Pat. No. 5,788,799. The disclosure of each of the above is incorporated herein by reference in its entirety.

Further, the excitation of the reaction gas may comprise exciting the additive gas and contacting the excited additive gas and the source gas. The excitation of the reaction gas can be accomplished in the reactor or upstream of the reactor. As described above, both the source gas and the additive gas can be excited in a remote plasma chamber. Alternatively, the excitation of the reaction gas can be accomplished by exciting the additive gas in a remote plasma chamber and mixing it with the source gas downstream of the remote plasma chamber. Alternatively, the reaction gas can be heated in a pre-heat chamber installed upstream of a reactor, the reaction gas is excited in the reactor, and film is deposited on the substrate in the reactor. The source gas and the additive gas can be introduced into the pre-heater chamber. In this case, the reaction space is composed of the interior of the pre-heater chamber, the interior of the reactor, and the interior of the piping connecting the pre-heater chamber and the reactor. Because of using the interior of the pre-heat chamber, the interior of the reactor can be significantly reduced, and thus, the distance between the upper electrode and the lower electrode can be reduced. This leads to not only downsizing the reactor, but also uniformly controlling a plasma over the substrate surface. Any suitable remote plasma chamber and any suitable operation conditions can be used in the present invention. For example, usable are the apparatus and the conditions disclosed in the aforesaid references.

Further, the excitation of the reaction gas comprises exciting the additive gas and contacting the excited additive gas and the source gas. In this embodiment, the additive gas can be excited in a remote plasma chamber, and the source gas is heated in a pre-heater chamber where the excited additive gas and the source gas are in contact, and then the reaction gas flows into the reactor for deposition of a film. In this case, deposition of unwanted particles on a surface of the remote plasma chamber, which causes a failure of ignition or firing, can effectively be avoided, because only the additive gas is present in the remote plasma chamber. The source gas is mixed with the excited additive gas downstream of the remote plasma chamber.

In order to form siloxan polymers or oligomers in the present invention, the residence time of a reaction gas may be controlled as disclosed in U.S. Pat. No. 6,352,945, U.S. Pat. No. 6,383,955, and U.S. Pat. No. 6,432,846, all of which are incorporated herein by reference in their entirety. However, in the present invention, the residence time can very more widely than the above. In embodiments, Rt may be 50 msec or higher (including 70 msec, 90 msec, 100 msec, 150 msec, 200 msec, 250 msec, and ranges including any of the forgoing).

The flow rate of the reaction gas is determined based on the intensity of RF power, the pressure selected for reaction, and the type of source gas and cross-linking gas. The reaction pressure is normally in the range of 1-10 Torr, preferably 3-7 Torr, so as to maintain a stable plasma. This reaction pressure is relatively high in order to lengthen the residence time of the reaction gas. The total flow of the reaction gas is important for reducing the relative dielectric constant of a resulting film. In general, the longer the residence time, the lower the relative dielectric constant becomes. The source gas flow necessary for forming a film depends on the desired deposition rate and the area of a substrate on which a film is formed. For example, in order to form a film on a substrate [r(radius)=100 mm] at a deposition rate of 300 nm/min, at least 50 sccm of the source gas (preferably 100-500 sccm, including 150, 200, 250 sccm) is expected to be included in the reaction gas. A temperature of the semiconductor wafer may be maintained at a temperature of e.g., 350 to 450° C.

EXAMPLES

Examples of the present invention will be described below, wherein as a source gas, divinyldimethylsilan (DVDMS), dimethyldimethoxysilane (DMDMOS), 1,1,3,3-tetramethyldimethoxydisiloxane (TMDMOS), and 1,3,5-trimethyl-1,3,5-trivinyilycyclotrisiloxane (TMTVS) were used. As a plasma CVD apparatus, Eagle™-10 (manufactured by ASM Japan in Tokyo) was used.

Examples 1-5

Using the plasma CVD apparatus, an insulation film was formed on a φ200 mm silicon substrate by changing the ratio of DVDMS to DMDMOS. Experimental conditions and results are shown in Table 1.

TABLE 1

|  | Example | | | | |
| --- | --- | --- | --- | --- | --- |
|  | 1 | 2 | 3 | 4 | 5 |
| DVDMS [sccm] | 134 | 114 | 94 | 54 | 0 |
| DMDMOS [sccm] | 0 | 20 | 40 | 80 | 134 |
| Ratio | 100% | 85% | 70% | 40% | 0% |
| He [sccm] | 140 | 140 | 140 | 140 | 140 |
| HRF* [W] | 950 | 950 | 950 | 950 | 950 |
| Press [Torr] | 4.5 | 4.5 | 4.5 | 4.5 | 4.5 |
| k-value | 2.79 | 2.79 | 2.81 | 2.90 | 3.23 |
| Stress [MPa] | 28.8 | 32.4 | 39.7 | 41.5 | 72.4 |

*27.12 MHz

Examples 6-10

Using the plasma CVD apparatus, an insulation film was formed on a φ200 mm silicon substrate by changing the ratio of DVDMS to TMDMOS. Experimental conditions and results are shown in Table 2.

TABLE 2

|  | Example | | | | |
| --- | --- | --- | --- | --- | --- |
|  | 6 | 7 | 8 | 9 | 10 |
| DVDMS [sccm] | 134 | 114 | 67 | 40 | 0 |
| TMDMOS [sccm] | 0 | 20 | 67 | 94 | 134 |
| Ratio | 100% | 85% | 50% | 30% | 0% |
| He [sccm] | 140 | 140 | 140 | 140 | 140 |
| HRF* [W] | 950 | 950 | 950 | 950 | 950 |
| Press [Torr] | 4.5 | 4.5 | 4.5 | 4.5 | 4.5 |
| k-value | 2.72 | 2.72 | 2.68 | 2.72 | 3.00 |
| stress | 36 | 41 | 45 | 44 | 53 |

*27.12 MHz

Figure 2:
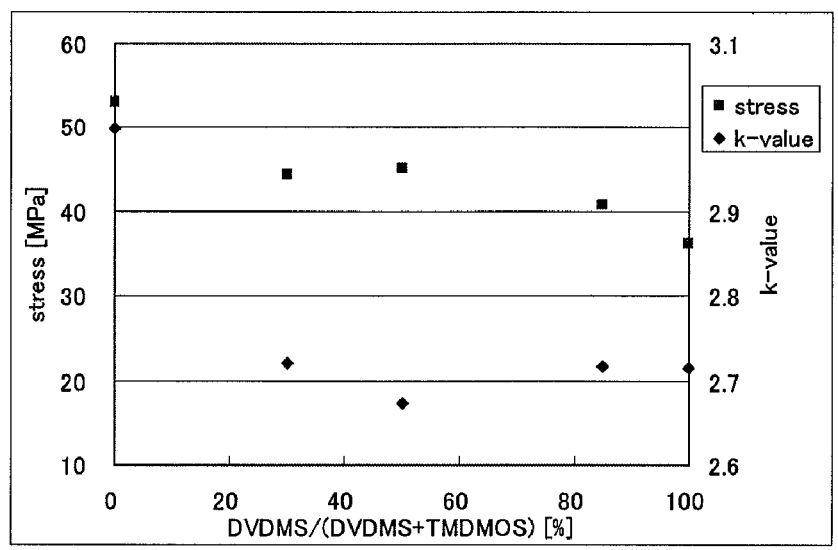
FIG. 2 is a graph illustrating the relationship between the ratio of divinyldimethylsilan (DVDMS)/(divinyldimethylsilan (DVDMS)+1,1,3,3-tetramethyldimethoxydisiloxane (TMDMOS)) and film stress and dielectric constant.

FIG. 1 is a graphs showing the relationship between the mixing ratio of DVDMS/DMDMOS and dielectric constants and film stress under the above-mentioned experimental conditions. FIG. 2 is a graphs showing the relationship between the mixing ratio of DVDMS/TMDMOS and dielectric constants and film stress under the above-mentioned experimental conditions. Both show that the higher the mixing ratio, the lower the dielectric constant and the lower the film stress become. Conventionally, to reduce film stress, low-frequency power and high-frequency power were overlaid. However, by doing so, the dielectric constant will increase. In the above embodiments, when the mixing ratio of DVDMS to DMDMOS was 100%, film stress was reduced to about 40% of that obtained when the ratio was 0% (100% DMDMOS), and further, the dielectric constant was 0.44 lower than that obtained when the ratio was 0%. When the mixing ratio of DVDMS to TMDMOS was 100%, film stress was reduced to about 70% of that obtained when the ratio was 0% (100% TMDMOS), and further, the dielectric constant was 0.3 lower than that obtained when the ratio was 0%. Thus, it is understood that by using a Si-vinyl compound as a source gas, both objectives, i.e., lowering a dielectric constant and lowering film stress, can effectively be accomplished simultaneously.

Examples 11-12

Using the plasma CVD apparatus, an insulation film was formed on a φ200 mm silicon substrate by using TMTVS and He. Experimental conditions and results are shown in Table 3.

TABLE 3

| | Example | |
|---|---|---|
| | 11 | 12 |
| 1,3,5-TMTVS [sccm] | 100 | 100 |
| He [sccm] | 180 | 100 |
| HRF [W] | 500 | 500 |
| Press [Torr] | 4 | 4 |
| k-value | 2.74 | 2.65 |
| Stress [MPa] | 35 | 32 |

* 27.12 MHz

Examples 13-16

Using the plasma CVD apparatus, an insulation film was formed on a φ200 mm silicon substrate by using DVDMS and TMDMOS as a source gas and further using He, O2, and isopropyl alcohol (IPA) as an additive gas. Experimental conditions and results are shown in Table 4. Rt (residence time) described above was about 93 msec in Examples 13 and 15, and about 73 msec in Examples 14 and 16.

TABLE 4

| | Example | | | |
|---|---|---|---|---|
| | 13 | 14 | 15 | 16 |
| DVDMS [sccm] | 67 | 67 | 20 | 20 |
| TMDMOS [sccm] | 67 | 67 | 114 | 114 |
| He [sccm] | 140 | 140 | 140 | 140 |
| O2 [sccm] | 110 | 110 | 110 | 110 |
| IPA [sccm] | 0 | 100 | 0 | 100 |
| HRF [W] | 950 | 950 | 950 | 950 |
| Press [Torr] | 6.0 | 6.0 | 6.0 | 6.0 |
| Stability** | unstable | stable | unstable | stable |
| k-value | — | 2.57 | — | 2.58 |
| Stress [MPa] | — | 50 | — | 54 |

* 27.12 MHz;
**plasma stability

In the above, in Examples 13 and 15, a plasma was unstable, and thus, deposition of a film was not successful. The examples show that when adding an oxidizing gas, plasma reaction is overly activated, thereby rendering a plasma unstable. However, by adding a plasma stabilizing gas, a plasma can be stabilized. When adding an inert gas in order to stabilize a plasma, instead of a plasma stabilizing gas, the dielectric constant increases.

According to the present invention, by using a Si-vinyl compound as a source gas, a dielectric film having low film stress can be manufactured without impact on the manufacturing cost and without sacrificing other film properties.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming a multi-layer silicon-containing insulation film on a substrate by plasma polymerization, comprising:
   introducing a reaction gas comprising (i) a source gas comprising a silicon-containing hydrocarbon cyclic compound having a silicon-containing ring and containing at least one vinyl group (Si-vinyl compound), and (ii) an additive gas, into a reaction chamber where a substrate is placed, wherein the Si-vinyl compound does not contain Si-O bonds in the silicon-containing ring, and the insulation film is a hard film composed of a silicon carbide material; and
   applying radio-frequency power to the gas to cause plasma polymerization, thereby depositing a multi-layer insulation film on the substrate, said radio-frequency power having a frequency of 2 MHz or higher without having a frequency of lower than 2 MHz, each layer having a dielectric constant of 3.0 or lower and a tensile stress of 60 MPa or lower.

2. The method according to claim 1, wherein the reaction gas further comprises (iii) a silicon-containing hydrocarbon compound (Si compound) having no vinyl group.

3. The method according to claim 2, wherein the introducing step further comprises controlling a ratio of the Si-vinyl compound to the Si compound in the range of 50% to 100%.

4. The method according to claim 2, wherein the Si compound is a compound or compounds selected from the group consisting of linear compounds having the formula $Si_\alpha O_{\alpha-1} R_{2\alpha-\beta+2}(OR)_{\beta2}$ wherein α is an integer of 1-3, β is 0, 1, or 2, R is $C_{1-6}$ saturated hydrocarbon; and cyclic compounds having the formula $Si_n O_n R_{2n}$, wherein n is an integer of 3-6, R is $C_{1-6}$ saturated hydrocarbon.

5. The method according to claim 2, wherein a ratio of the Si-vinyl compound to the Si compound is controlled to obtain a siloxan polymer having a film stress of 40 MPa or lower and a dielectric constant of 3.0 or lower.

6. The method according to claim 2, wherein the Si compound does not contain Si-O bonds, and the insulation film is a hard film composed of a silicon carbide material.

7. The method according to claim 1, wherein the additive gas is selected from the group consisting of a carrier gas, an oxidizing gas, and a plasma stabilizing gas.

8. The method according to claim 7, wherein the plasma stabilizing gas is selected from the group consisting of $H_2$, $CnH_{2n+2}$, $C_nH_{2n}$, and $CnH_{2n+1}OH$ wherein n is an integer of 1-5.

9. The method according to claim 7, wherein the oxidizing gas is selected from the group consisting of $O_2$, $CO_2$, $H_2O$, $O_3$, and $NO_2$.

10. The method according to claim 7, wherein the carrier gas is an inert gas selected from the group consisting of He, Ar, and $N_2$.

11. The method according to claim 1, wherein the Si-vinyl compound has a formula $Si_p(C_2H_2)_p R_{2p}$, wherein p is an integer of 3-6, and R is $C_{1-6}$ saturated or unsaturated hydrocarbon.

* * * * *

UNITED STATES PATENT AND TRADEMARK OFFICE
CERTIFICATE OF CORRECTION

PATENT NO. : 7,655,577 B2
APPLICATION NO. : 11/550930
DATED : February 2, 2010
INVENTOR(S) : Yasuyoshi Hyodo et al.

It is certified that error appears in the above-identified patent and that said Letters Patent is hereby corrected as shown below:

At Column 2, Line 9-10, please delete "$Si_\alpha O_{60-1} R_{2\alpha-\beta+2}(OR)_\beta$" and insert --$Si_\alpha O_{\alpha-1} R_{2\alpha-\beta+2}(OR)_\beta$-- therefor.

At Column 12, Line 38, please delete "$Si_\alpha O_{\alpha-1} R_{2\alpha-\beta+2}(OR)_{62}$" and insert --$Si_\alpha O_{\alpha-1} R_{2\alpha-\beta+2}(OR)_\beta$-- therefor.

Signed and Sealed this

Twentieth Day of July, 2010

David J. Kappos
*Director of the United States Patent and Trademark Office*